United States Patent [19]

Kobayashi

[11] Patent Number: 5,741,362
[45] Date of Patent: Apr. 21, 1998

[54] WAFER SURFACE TREATING APPARATUS USING CHEMICAL

[75] Inventor: Takaaki Kobayashi, Tokyo, Japan

[73] Assignee: NEC Corporation, Japan

[21] Appl. No.: 543,286

[22] Filed: Oct. 16, 1995

[30] Foreign Application Priority Data

Oct. 18, 1994  [JP]  Japan ................................ 6-252029

[51] Int. Cl.$^6$ ................................ B05C 11/00; B08B 3/00
[52] U.S. Cl. ........................ 118/603; 118/610; 118/666; 134/110; 134/108
[58] Field of Search ........................ 118/603, 600, 118/602, 665, 666, 667; 400/407; 437/230; 205/157; 134/902, 110.1, 108, 109, 111; 414/935–940; 141/82; 137/563, 577, 590.5

[56] References Cited

FOREIGN PATENT DOCUMENTS

| 60-16427 | 1/1985 | Japan . |
| 63-65621 | 12/1988 | Japan . |
| 7050282 | 2/1995 | Japan . |

*Primary Examiner*—Donald E. Czaja
*Assistant Examiner*—Calvin Padgett
*Attorney, Agent, or Firm*—Hayes, Soloway, Hennessey, Grossman & Hage, P.C.

[57] ABSTRACT

A wafer surface treating apparatus has an overflow treating tank for holding therein a chemical in which a wafer is to be soaked to perform a surface treatment of the wafer, piping for circulating the chemical overflowing from said treating tank to said treating tank, a filter unit for filtering the chemical passing through said piping to remove foreign articles from the chemical, and at least two temperature regulating mechanisms. The first temperature regulating mechanism keeps a temperature of the chemical in said treating tank at a predetermined temperature. The second temperature regulating mechanism regulates the temperature of the chemical in said filter unit to a temperature at which no deposit is produced from the chemical in said filter.

5 Claims, 2 Drawing Sheets

5,741,362

WAFER SURFACE TREATING APPARATUS USING CHEMICAL

BACKGROUND OF THE INVENTION

1. Field of the Invention

This invention relates to a wafer surface treating apparatus which performs, using chemical, a treatment such as that for forming an electroless plated film or an oxide insulator film on the surface of a wafer.

2. Description of the Related Art

Conventionally, as a wafer surface treating apparatus of the type mentioned, a wafer surface treating apparatus having such a construction as shown in FIG. 1 is known. The conventional wafer surface treating apparatus shown in FIG. 1 includes an overflow treating tank 101 which is filled with a chemical 103 and performs a surface treatment of a wafer 104 soaked in the chemical 103, and an outer tank 102 for receiving the chemical 103 overflowing from the treating tank 101. The treating tank 101 and the outer tank 102 are communicated with each other by a piping 107 which has a pump 105 and a filter unit 106 provided intermediately thereof. The pump 105 is normally driven during the treatment of the wafer 104 and returns the chemical 103 received by the outer tank 102 to the treating tank 101 to circulate the chemical 103. The filter unit 106 is interposed between the treating tank 101 and the pump. 105 and filters the chemical 103 to remove foreign articles and so forth from the chemical 103.

Upon surface treatment of the wafer 104, since the temperature of the chemical 103 in the treating tank 101 must be kept at a fixed level, a temperature regulating mechanism 110 for regulating the temperature of the chemical 103 is provided in the treating tank 101. The temperature regulating mechanism 110 includes a temperature sensor ill for detecting the temperature of the chemical 103 in the treating tank 101, a temperature adjuster 113 for heating or cooling the treating tank 101 to adjust the temperature of the chemical 103 in the treating tank 101, and a controller 112 for controlling the temperature adjuster 113 in response to a result of detection of the temperature sensor 111. By regulating the temperature of the chemical 103 by means of the temperature regulating mechanism 110, the growth rate of, for example, an electroless plated film or an oxide insulator film is kept fixed.

While, in the conventional example described above, the temperature of the treating tank 101 is controlled directly in order to keep the temperature of the chemical 103 in the treating tank 101 fixed, also another wafer surface treating apparatus has been proposed wherein a chemical temperature regulator (not shown) is interposed between the filter unit 106 and the treating tank 101. In this example, the temperature of the chemical 103 is regulated to the fixed temperature described above by the chemical temperature regulator, and the chemical 103 of the thus regulated temperature is supplied to the treating tank 101 to keep the temperature of the chemical 103 in the treating tank 101 fixed (refer to Japanese Patent Laid-Open Application No. Showa 60-16427).

In those conventional wafer surface treating apparatuses, since the temperature of the chemical is regulated to a temperature required to perform a surface treatment of a wafer, the temperature does not vary greatly in the chemical circulation system. Therefore, the conventional wafer surface treating apparatus are disadvantageous in that, if a wafer surface treating apparatus of the type described above is used for formation of, for example, an electroless plated film or a liquid phase oxide film, a plated film or an oxide film grows in a filter unit around nuclei provided by foreign articles caught by the filter unit, which is liable to cause blinding of the filter unit.

SUMMARY OF THE INVENTION

It is an object of the present invention to provide a wafer surface treating apparatus which prevents the blinding of a filter unit and can perform a surface treatment of a wafer efficiently.

In order to attain the object described above, according to the present invention, there is provided a wafer surface treating apparatus, comprising an overflow treating tank for holding therein a chemical into which a wafer is to be soaked to perform a surface treatment of the wafer, a first temperature regulating mechanism for keeping a temperature of the chemical in the treating tank at a predetermined temperature, piping for circulating the chemical overflowing from the treating tank to the treating tank, a filter unit for filtering the chemical passing through the piping to remove foreign articles from the chemical, and a second temperature regulating mechanism for regulating the temperature of the chemical in the filter unit to a temperature at which no deposit is produced from the chemical.

The wafer surface treating apparatus may further comprise a third temperature regulating mechanism provided at a location of the piping between the filter unit and the treating tank for regulating the temperature of the chemical flowing at the location to a temperature between the temperature of the chemical at the filter unit and the temperature of the chemical at the treating tank.

In the wafer surface treating apparatus of the present invention having the construction described above, a surface treatment of a wafer is performed by soaking the wafer in a treating tank filled with chemical. The treating tank is of the overflow type, and the chemical overflowing the treating tank is fed along the piping to and filtered by the filter unit to remove foreign articles therefrom and is then returned to the treating tank. Since the second temperature regulating mechanism for regulating the temperature of the chemical in the filter unit to the temperature at which no deposit is produced from the chemical is provided in the filter unit, no deposit is produced in the filter unit, and blinding of the filter unit by foreign articles is prevented. Further, since no deposit is produced in the filter Unit, the concentration of the chemical does not exhibit a variation, and consequently, the surface treatment of the wafer is performed stably.

Generally, where the surface treatment of a wafer is a film formation treatment wherein a film containing a component of the chemical is formed on the surface of the wafer, the chemical in the treating tank is kept at a temperature necessary for deposition or formation of a film, and also in the filter unit, a substance to form a film is liable to be deposited or formed. Therefore, to regulate the temperature at the filter unit in such a manner as described above to prevent formation of a deposit is particularly effective for a film formation treatment such as an electroless metal film formation treatment or a liquid phase oxide film formation treatment.

Further, in the wafer surface treating apparatus which includes the third temperature regulating mechanism provided at a location of the piping between the filter unit and the treating tank, the temperature of the chemical flowing at the location is regulated to a temperature between the temperature of the chemical for the filter unit and the temperature of the chemical for the treating tank.

Accordingly, when the chemical whose temperature has been regulated by the filter unit is supplied to the treating tank again, the temperature of the chemical thus supplied smoothly reaches the temperature of the treating tank.

DESCRIPTION OF THE PREFERRED EMBODIMENTS

Embodiments of the present invention are described below with reference to the drawings.

Figure 2:
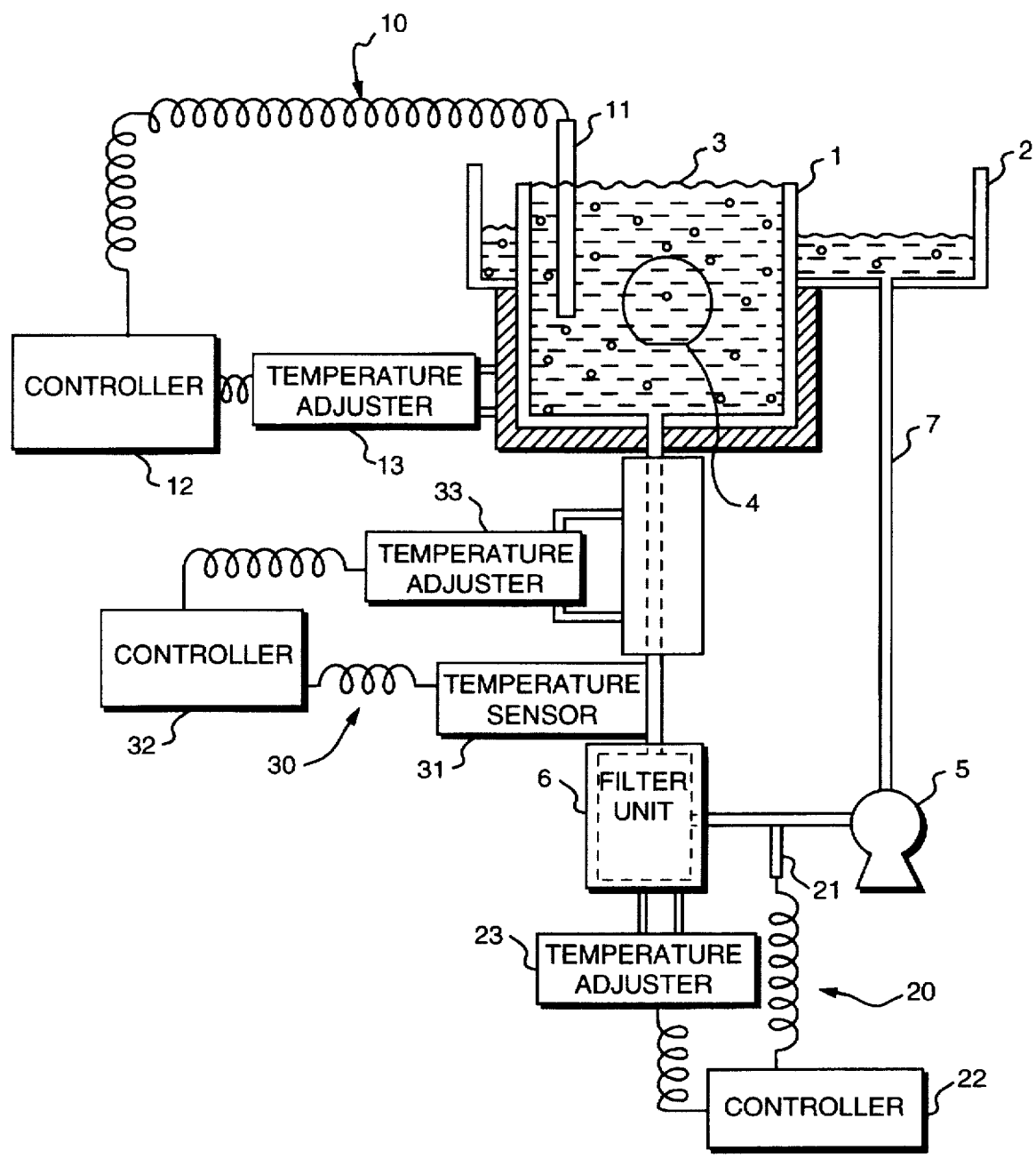
FIG. 2 is a schematic view showing a construction of an embodiment of a wafer surface treating apparatus of the present invention.

FIG. 2 is a schematic view showing a construction of an embodiment of a wafer surface treating apparatus of the present invention. Referring to FIG. 2, the wafer surface treating apparatus is similar to the conventional wafer surface treating apparatus in that it includes an overflow treating tank 1 which is filled with a chemical 3 and performs a surface treatment of a wafer 4 soaked in the chemical 3, and an outer tank 2 for receiving the chemical 3 overflowing from the treating tank 1, and the treating tank 1 and the outer tank 2 are communicated with each other by a piping 7 which has a pump 5 and a filter unit 6 provided intermediately thereof.

The present wafer surface treating apparatus is different from the conventional wafer surface treating apparatus in that it includes, as means for regulating the temperature of the chemical 3, three temperature regulating mechanism for regulating the temperature of the chemical 3 independently of each other. In particular, the present wafer surface treating apparatus includes a first temperature regulating mechanism 10 for regulating the temperature of the chemical 3 in the treating tank 1, a second temperature regulating mechanism 20 for regulating the temperature of the chemical 3 in the filter unit 6, and a third temperature regulating mechanism 30 for regulating the temperature of the chemical 3 flowing in the piping 7 between the filter unit 6 and the treating tank 1.

Figure 1:
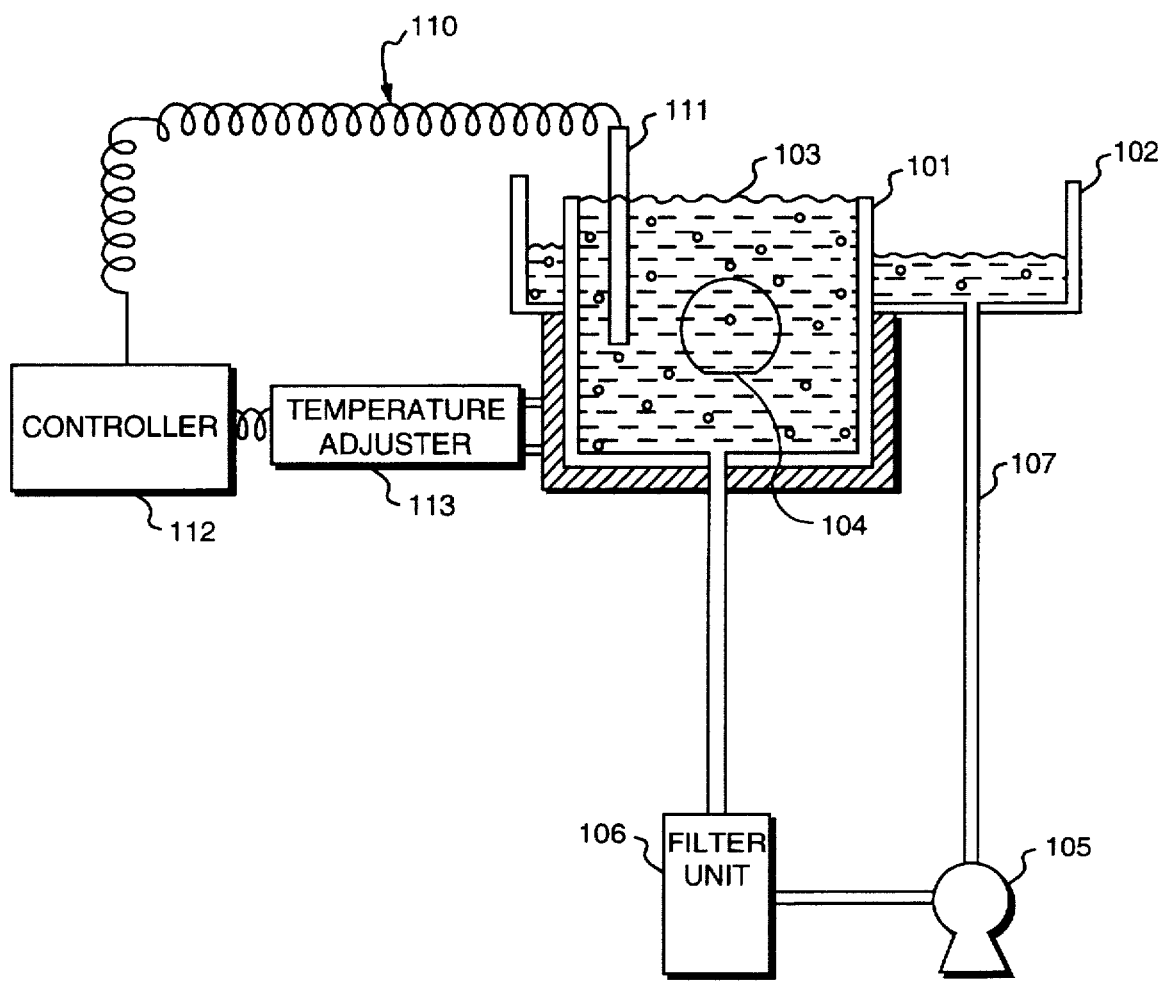
FIG. 1 is a schematic view showing a construction of a conventional wafer surface treating apparatus.

The first temperature regulating mechanism 10 includes, similarly to the temperature regulating mechanism 110 shown in FIG. 1, a temperature sensor 11 for detecting the temperature of the chemical 3 in the treating tank 1, a temperature adjuster 13 for heating or cooling the treating tank 1 to adjust the temperature of the chemical 3 in the treating tank 1, and a controller 12 for controlling the temperature adjuster 13 in response to a result of detection of the temperature sensor 11.

The second temperature regulating mechanism 20 includes a temperature sensor 21 for detecting the temperature of the chemical 3 flowing in the piping 7 between the pump 5 and the filter unit 6, a temperature adjuster 23 for adjusting the temperature of the filter unit 6 to regulate the temperature of the chemical 3 in the filter unit 6, and a controller 22 for controlling the temperature adjuster 23 in response to a result of detection of the temperature sensor 21.

The third temperature regulating mechanism 30 includes a temperature sensor 31 for detecting the temperature of the chemical 3 flowing in the piping 7 between the filter unit 6 and the treating tank 1, a temperature adjuster 33 for adjusting the temperature of the piping 7 between the filter unit 6 and the treating tank 1 to regulate the temperature of the chemical 3 in the region, and a controller 32 for controlling the temperature adjuster 33 in response to a result of detection of the temperature sensor 31.

In the wafer surface treating apparatus of the construction described above, the chemical 3 in the treating tank 1 is kept at a fixed temperature required for the surface treatment of the wafer 4 by the first temperature regulating mechanism 10, and the wafer 4 is soaked in the chemical 3 to perform a treatment for the surface of the wafer 4.

The chemical 3 overflowing the treating tank 1 is received by the outer tank 2 and is returned into the treating tank 1 by the pump 5 by way of the piping 7. On the way, the chemical 3 is filtered by the filter unit 6 to remove foreign articles and so forth therefrom. Further, since the filter unit 6 is controlled by the second temperature regulating mechanism 20 so that the temperature of the chemical 3 in the filter unit 6 may be a temperature at which a formation reaction does not occur or a solution reaction temperature, no deposit is produced in the filter unit 6. Accordingly, the present invention is particularly effective where the surface treatment of a wafer is a film formation treatment wherein a film containing a component of the chemical is formed on the surface of the wafer such as formation of an electroless metal film or formation of a liquid phase oxide film.

And, between the filter unit 6 and the treating tank 1, the temperature of the chemical 3 is regulated so that it may be a temperature between the temperature to which it is regulated by the first temperature regulating mechanism 10 and the temperature to which it is regulated by the second temperature regulating mechanism 20. Consequently, since the temperature of the chemical 3 whose temperature has been regulated by the second temperature regulating mechanism 20 smoothly reaches a fixed temperature required for the surface treatment of the wafer 4, also the temperature variation by the treating tank 1 may be small. As a result, the surface treatment for the wafer 4 can be performed with a higher degree of stability.

Next, detailed examples of the surface treatment for the wafer 4 using the wafer surface treating apparatus described above are described with reference to FIG. 2.

(EXAMPLE 1)

Formation of a liquid phase oxide film on the wafer 4 is described. Generally, formation of a liquid phase oxide film is a method of selectively forming an oxide insulator film on the surface of the wafer 4 making use of a reversible reaction of hydrofluosilic acid solution ($SiF_6$), and in the formation, a formation reaction and a solution reaction can be controlled by regulating the temperature of the solution.

For example, using hydrofluosilic acid solution to which Al is added as the chemical 3, the temperature of the chemical 3 in the treating tank 1 is regulated by the first temperature regulating mechanism 10 so as to be 35° to 40° C. which is a temperature at which an oxide insulating substance is deposited. Then, the wafer 4 is soaked in the chemical 3, and the chemical 3 is circulated using the pump 5 and filtered so that an oxide insulator film is selectively formed on the surface of the wafer 4.

In this instance, the temperature of the chemical 3 in the filter unit 6 is regulated by the second temperature regulating mechanism 20 to 20° to 25° C. which is a solution reaction direction, and further, the temperature of the chemical 3 flowing in the piping 7 from the filter unit 6 to the treating tank 1 is adjusted to 30° to 35° C. by the third temperature regulating mechanism 30. Since the chemical 3 is cooled to the solution reaction temperature in the filter unit 6, an oxide insulating substance around nuclei provided by foreign articles caught by the filter unit 6 is not produced in the filter unit 6, and consequently, blinding of the filter unit 6 which is otherwise caused by such oxide insulating substance does not occur.

More particularly, although blinding of the filter unit 6 conventionally occurs in substantially 5 hours after starting of a treatment, a continuous treatment for 24 hours has become possible by regulating the temperature of the filter unit 6 as in the present embodiment. Further, since no deposit of the chemical 3 is produced in the filter unit 6, the concentration of the chemical 3 is free from variation, and the growth of a film on the wafer 4 can be performed stably.

Meanwhile, since the chemical 3 cooled in the filter unit 6 is heated to a temperature proximate to a deposition reaction temperature of an oxide insulating substance before it is returned to the treating tank 1, when the chemical 3 is returned to the treating tank 1, the temperature thereof reaches the preset temperature of the treating tank 1 smoothly. Consequently, also the temperature variation by the treating tank 1 may be small, and the growth of a film on the wafer 4 can be performed more stably.

(EXAMPLE 2)

Next, formation of an electroless plated gold film on the wafer 4 is described. Generally, formation of an electroless plated gold film is a method of selectively forming a plated gold film on the surface of the wafer 4 making use of an oxidation-reduction reaction of a gold sulfate, and in the formation, the formation reaction rate can be controlled by regulating the temperature of gold sulfate solution.

For example, using a solution which contains gold sodium sulfate as a principal component as the chemical 3, the temperature of the chemical 3 in the treating tank 1 is regulated by the first temperature regulating mechanism 10 to 65° to 70° C. which is a temperature at which a plated gold film is deposited. Then, the wafer 4 is soaked in the chemical 3, and the chemical 3 is circulated using the pump 5 and filtered so that a plated gold film is selectively formed on the surface of the wafer 4.

In this instance, the temperature of the chemical 3 in the filter unit 6 is regulated by the second temperature regulating mechanism 20 to 20° to 25° C. at which a formation reaction does not occur, and further, the temperature of the chemical 3 flowing in the piping 7 from the filter unit 6 to the treating tank 1 is adjusted to 60° to 65° C. by the third temperature regulating mechanism 30. Since the chemical 3 is cooled in the filter unit 6 to the temperature at which a formation reaction does not occur, plated gold around nuclei provided by foreign articles caught by the filter unit 6 is not abnormally produced in the filter unit 6, and consequently, blinding of the filter unit 6 which is otherwise caused by such plated gold does not occur. Further, since no abnormal production of plated gold occurs in the filter unit 6, also the variation of the concentration of the chemical 3 is eliminated, and consequently, the growth of a plated gold film on the wafer 4 can be performed stably.

Meanwhile, since the chemical 3 cooled in the filter unit 6 is heated to a temperature proximate to a deposition temperature of a plated gold film before it is returned to the treating tank 1, when the chemical 3 is returned to the treating tank 1, the temperature thereof reaches the preset temperature of the treating tank 1 smoothly. Consequently, also the temperature variation by the treating tank 1 is small, and the growth of a film on the wafer 4 can be performed more stably.

While, in the embodiment described above, the third temperature regulating mechanism 30 is provided in the piping 7 between the filter unit 6 and the treating tank 1, where the temperature difference between the temperature set for the filter unit 6 and the temperature set for the treating tank 1 is not great, or where the wafer surface treating apparatus is otherwise so constructed that the first temperature regulating mechanism 10 is provided in the piping 7 between the filter unit 6 and the treating tank 1 and the chemical 3 whose temperature has been adjusted to a predetermined temperature by the first temperature regulating mechanism 10 is supplied to the treating tank 1 (for example, where the wafer surface treating apparatus has such a construction as disclosed in Japanese Patent Laid-Open Application No. Showa 60-16427 mentioned hereinabove), the third temperature regulating mechanism 30 can be omitted. On the contrary, where the temperature difference between the temperature set for the filter unit 6 and the temperature set for the treating tank 1 is so great that the temperature of the chemical 3 to be supplied to the treating tank 1 cannot be regulated to a temperature proximate to the temperature set for the treating tank 1 singly by means of the third temperature regulating mechanism 30, at least one other temperature regulating mechanism may be provided in addition and in series to the third temperature regulating mechanism 30 in the piping 7 so that the temperature of the chemical 3 flowing in the piping 7 may stepwise approach a temperature proximate to the temperature set for the treating tank 1.

What is claimed is:

1. A wafer surface treating apparatus, comprising:

an overflow treating tank for holding therein a chemical in which a wafer is to be soaked with to perform a surface treatment of the wafer;

a first temperature regulating mechanism for keeping a temperature of the chemical, in said treating tank at a predetermined temperature;

a piping for circulating the chemical overflowing out of said treating tank back into said treating tank;

a filter unit for filtering the chemical, passing through said piping to remove foreign articles from the chemical; and a second temperature regulating mechanism for regulating the temperature of the chemical in said filter unit to a temperature at which no deposit is produced from the chemical in said filter.

2. A wafer surface treating apparatus as claimed in claim 1, wherein the surface treatment is a film formation treatment to form a film containing some of components of the chemical on the surface of the wafer.

3. A wafer surface treating apparatus as claimed in claim 2, wherein the film formation treatment is an electroless metal film formation treatment.

4. A wafer surface treating apparatus as claimed in claim 2, wherein the film formation treatment is a liquid phase oxide film formation treatment.

5. A wafer surface treating apparatus as claimed in claim 1, further comprising a third temperature regulating mechanism provided at a location of said piping between said filter unit and said treating tank for regulating the temperature of the chemical flowing at the location to a temperature between the temperature of the chemical at said filter unit and the temperature of the chemical at said treating tank.

* * * * *